United States Patent [19]

Dijkmans

[11] 4,224,571
[45] Sep. 23, 1980

[54] DELTA MODULATION DECODER WITH CHARGE QUANTA MAGNITUDE CORRECTION

[75] Inventor: Eise C. Dijkmans, Eindhoven, Netherlands

[73] Assignee: U.S. Philips Corporation, New York, N.Y.

[21] Appl. No.: 956,550

[22] Filed: Oct. 30, 1978

[30] Foreign Application Priority Data

Nov. 18, 1977 [NL] Netherlands ........................ 7712706

[51] Int. Cl.$^2$ ............................................ H03K 13/02
[52] U.S. Cl. ................................... 375/28; 332/11 D; 340/347 DA; 340/347 M
[58] Field of Search ..................... 325/38 B; 332/11 D; 340/347 M, 347 DA

[56] References Cited

U.S. PATENT DOCUMENTS

| 3,750,143 | 7/1973 | Osborne | 332/11 D |
| 4,101,881 | 7/1978 | De Freitas | 332/11 D |

Primary Examiner—Thomas J. Sloyan
Attorney, Agent, or Firm—Thomas A. Briody; William J. Streeter; Edward W. Goodman

[57] ABSTRACT

Delta modulation decoder comprising an integrating network provided with a first integrating capacitor which is on the one hand connected to an input terminal of the integrating network and on the other hand to ground potential through a second integrating capacitor. The 1-pulses and the 0-pulses of the delta modulation signal, applied to the decoder, are applied to a current source circuit generating a positive charging quantum in response to each 1-pulse and a negative charging quantum in response to each 0-pulse. Said charging quanta are applied to the input terminal of the integrating network through a correction network. This correction network is controlled by the voltage $V_{C3}$ across the second integrating capacitor, so that, if $V_{C3}$ is positive, the positive charging quanta are reduced and-/or the negative charging quanta increased and that, if $V_{C3}$ is negative, the positive charging quanta are increased and/or the negative charging quanta reduced.

1 Claim, 3 Drawing Figures

DELTA MODULATION DECODER WITH CHARGE QUANTA MAGNITUDE CORRECTION

A. BACKGROUND OF THE INVENTION (1) Field of the Invention

The invention relates to a delta modulation decoder for converting a digital signal into an analog signal, this digital signal being constituted by a sequence of pulses of a first kind, for example "1" pulses, and of pulses of a second kind, for example "0" pulses. Although a delta modulation decoder is used at both the transmitting end and at the receiving end of a transmission system for transmitting analog signals by means of delta modulation the present delta modulation decoder is particularly intended for use at the receiving end of such a transmission system.

(2) Description of the Prior Art

Particulaly advantageous embodiments of delta modulation decoders are disclosed in references 1 and 2 (chapter D).

In general, such decoders comprise:
an integrating network including a first integration capacitor as well as a first input and output terminal and a common second input and output terminal,
means to which the digital signal is applied for producing in response to each of the pulses of the first kind a positive charge quantum and for producing a negative charge quantum in response to each of the pulses of the second kind,
means for applying said charge quanta to said first integrating capacitor.

By applying a positive charge quantum the output voltage of the integrating network is increased by a given value. By applying a negative charge quantum the output voltage of the integrating network is reduced by the same value. One of the problems generally occurring in a transmitter and in a receiver of a delta modulation transmission system is that, in the transmitter as well as in the receiver, the magnitude of the positive charge quanta is never equal to the magnitude of the negative charge quanta. If, in addition, the difference between the magnitude of the positive and the magnitude of the negative charge quanta in the transmitter are different from the difference between the magnitude of the positive and negative charge quanta in the receiver, serious deviations from the desired linearity of the signal transmission are then produced.

To keep these linearity deviations of the signal transmission below a permissible limit, it is essential, both for the transmitters and for the receivers described in references 1 and 2, that the positive and negative charge quanta are exactly identical. A completely different solution to keep the linearity deviations of the signal transmission below a permissible limit, which results in a completely new set-up of a delta modulation decoder, is described in reference 3. The operation of this prior art decoder is based on the transport of charge from a first capacitor to the integrating capacitor in the integrating network. In this prior art device the magnitude of the positive charge quantum is each time determined by the output voltage of the integrating network. To this end, this output voltage is applied to a compensation circuit which ensures that the magnitude of the voltage across the first capacitor is made approximately equal to the magnitude of the output voltage of the integrating network. In contradistinction to the arrangements described in references 1 and 2, it is ensured in this prior art delta modulation decoder that the ratio of the magnitude of positive and negative charge quanta is equal to the ratio of the magnitude of positive and negative charge quanta used in the transmitter (delta-modulation coder).

SUMMARY OF THE INVENTION

It is an object of the invention to improve existing prior art conventional delta-modulation decoders, for example, those delta modulation decoders described in the reference 1 and 2, in such a manner that in such a delta modulation decoder, used as the receiver in a telecommunication system, the ratio between the magnitude of the positive and the negative charge quanta is equal to the ratio between the magnitudes of the positive and negative charge quanta used in the transmitter, so that it is not necessary, as suggested in reference 3, to realize a completely new decoder which deviates from the conventional set-up. In accordance with the invention, the common second input and output terminal of the integrated circuit are connected to this end to a source of fixed reference potential through a second integrating capacitor and the decoder furthermore comprises means to which the voltage across the second integration capacitor is applied for controlling the magnitude of at least one of the two kinds of charge quanta applied to the first integrating capacitor.

In the decoder described in reference 3 the magnitude of the next positive charge quantum is immediately readjusted in case of a deviation from the required ratio between the positive and negative charge quanta, and that in such a way that this deviation is compensated for. In contradistinction thereto, an averaging operation is effected in the arrangement according to the invention whereby the magnitude of the charge quanta is adjusted depending on the average deviation from the desired ratio between positive and negative charge quanta. The result is that, in the arrangement according to the invention, it is possible to correct larger deviations between positive and negative charge quanta than is possible in the arrangement described in reference 3, which favorably affects the signal-to-noise ratio.

SHORT DESCRIPTION OF THE FIGURES

REFERENCES

1. U.S. Pat. No. 4,039,950 (PHN 7893).
2. Delta modulation; H. R. Schindler; IEEE Spectrum Volume Oct. 7, 1970; pages 69–78.
3. U.S. Pat. No. 3,754,234.
4. Delta modulation systems; R. Steels; Pentech Press London.
5. U.S. Pat. No. 3,729,678 (PHN 3027).

DESCRIPTION OF THE EMBODIMENTS

The general set-up of the decoder

Figure 1:
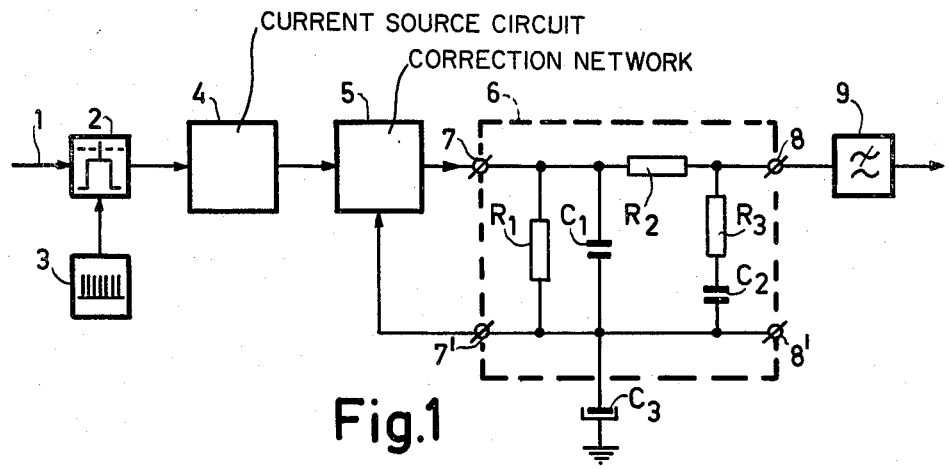
FIG. 1 illustrates a block-diagrammatic set-up of the delta modulation decoder according to the invention.

FIG. 1 shows the general set-up of the delta modulation decoder provided with the measures according to the invention.

In this general embodiment the pulses originating from a transmission line 1 are applied to a pulse regenerator 2 which is controlled by clock pulses of a clock pulse generator 3. The digital output signal of this pulse regenerator 2 is constituted, the same as its digital input signal, by a sequence of pulses of a first and a second kind. In the further course of this description a pulse of the first kind will be denoted a 1-pulse and a pulse of the second kind will be denoted a 0-pulse. These pulses are applied to a current source circuit 4. This current source circuit 4 produces a positive charge quantum $Q_{dec}$ each time a 1-pulse is applied to its input and produces a negative charge quantum $\overline{Q}_{dec}$ if a 0-pulse is applied to its input. The magnitude of each of these charge quanta is equal to the product of the current produced in the current source circuit 4 and the period of time a 1-pulse or a 0-pulse is present at its input. These charge quanta are applied through a correction network 5 to an integrating network 6, which is here implemented in known manner as a so-called double integrating network (see reference 4). This integrating network comprises a first input terminal 7 and a first output terminal 8, as well as a common second input and output terminal 7′ and 8′. A first integrating capacitor $C_1$ as well as a capacitor $C_2$ and resistors $R_1$, $R_2$ and $R_3$ are provided between these terminals in the manner shown.

The common second input terminal and output terminal 7′ and 8′ of the integrating network 6 are connected through a second integrating capacitor $C_3$ to ground potential. The capacitance of this capacitor $C_3$ is chosen to be many times larger than the capacitance of $C_1$, for example a factor of 100. The voltage across this capacitor $C_3$ is applied to the correction network 5 which, each time the voltage across $C_3$ changes in the positive direction, reduces the magnitude of the positive charge quanta and/or increases the magnitude of the negative charge quanta and which, each time the voltage $C_3$ changes in the negative direction, increases the magnitude of the positive charge quanta and/or reduces the magnitude of the negative charge quanta. The set-up of the compensation network as well as its operation will be described below.

To obtain the desired analog output voltage, the voltage present between the output terminal 8 of the integrated network 6 and ground is applied in known manner to a low-pass filter 9.

To further explain the operation of the decoder shown in FIG. 1, it is assumed that it constitutes a receiver co-operating with a transmitter in which an analog information signal is converted by means of delta modulation into a pulse train formed by a sequence of 1-pulses and 0-pulses. As known, a prediction signal is generated in such a transmitter which is compared at fixed time intervals to the information signal. Each time the prediction signal is smaller than the information signal a, for example, 1-pulse is generated and if the prediction signal exceeds the information signal a 0-pulse is generated. These 1-pulses and 0-pulses are now transmitted to the decoder shown in FIG. 1, which operates as the receiver. In the transmitter itself, these pulses are utilized for generating the prediction signal. To this end this transmitter comprises also an integrating network which is of the same implementation as the integrating network 6 shown in FIG. 1 and which also comprises an integrating capacitor corresponding to the capacitor $C_1$ in FIG. 1. For generating the prediction signal a positive charge quantum $Q_{cod}$ is each time applied in this transmitter in response to a 1-pulse to the integrating capacitor and conversely a negative charge quantum $\overline{Q}_{cod}$ is each time applied in response to a 0-pulse. When a given information signal (called reference information signal hereinafter) is applied to this transmitter, and when $Q_{cod}$ is exactly equal to $\overline{Q}_{cod}$ then this transmitter will produce a pulse series which will be denoted the reference series. When, however, $Q_{cod}$ is larger than $\overline{Q}_{cod}$ then the transmitter in response to the reference information signal produces a pulse series (called first pulse series hereinafter) which will contain more 0-pulses relative to the reference series. When on the contrary $Q_{cod}$ is smaller than $\overline{Q}_{cod}$ then the transmitter in response to the reference information signal produces a pulse series (called second pulse series hereinafter) which will contain more 1-pulses relative to the reference series.

When said reference pulse series is applied now to the decoder of FIG. 1 and when $Q_{dec}$ is exactly identical to $\overline{Q}_{dec}$ a signal is obtained at the output of the filter 9 the form of which is accurately identical to that of the reference information signal. Now a voltage is produced across capacitor $C_3$ which has the value zero on an average.

When the above-defined first pulse series is applied to this decoder and when $Q_{dec}$ is again equal to $\overline{Q}_{dec}$ a voltage $V_{C3}$, which is negative on the average and increases in magnitude, will then be build-up across the capacitor $C_3$. Due to this voltage $V_{C3}$, the positive charging quanta $Q_{dec}$, for example, will be increased to such an extent that this voltage $V_{C3}$ is reduced to a value $V_{C3R}$, this positive charging quanta $Q_{dec}$ then having such a value that the average voltage across the capacitor $C_3$ does not change anymore. This means that then $Q_{cod} = Q_{dec}$ and that $\overline{Q}_{cod} = \overline{Q}_{dec}$ or, in general $Q_{dec}/\overline{Q}_{dec} = Q_{cod}/\overline{Q}_{cod}$ as a consequence of which the signal occurring at the output of the filter 9 has a form which is exactly identical to the form of the reference signal.

When the above-defined second pulse series is applied to the decoder and $Q_{dec}$ is again equal to $\overline{Q}_{dec}$ a voltage $V_{C3}$ which is, on the average, positive and whose magnitude increases, will be build-up across the capacitor $C_3$. Due to this positive voltage $V_{C3}$ the positive charging quanta are, for example, again reduced to such an extent that this voltage $V_{C3}$ is reduced to a value $V_{C3R}$, these positive charging quanta $Q_{dec}$ then having such a value that the average voltage across capacitor $C_3$ does not change anymore. This means that in general $Q_{dec}/\overline{Q}_{dec} = Q_{cod}/\overline{Q}_{cod}$ again and that the form of the output signal of the filter 9 is exactly identical to the reference signal.

Furthermore it should be noted that the voltages $V_{C3R}$ are very low if the input sensitivity of the correction network 5 is high.

The correction network 5

Figure 2:
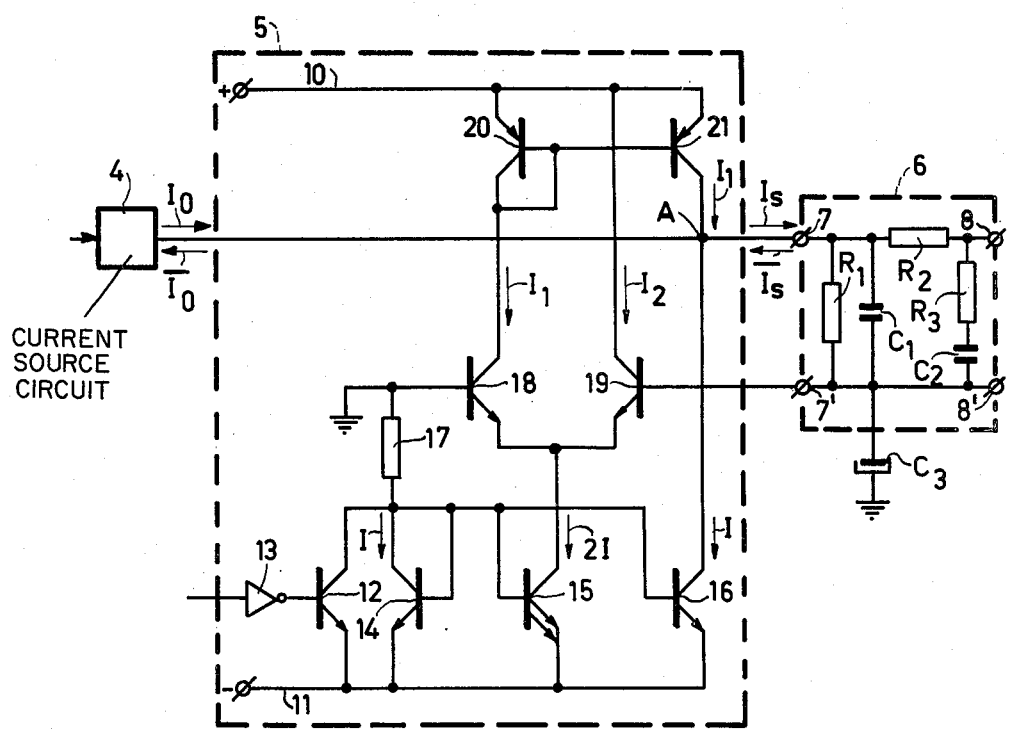
FIG. 2 shows an embodiment of a correction network for use in the decoder shown in FIG. 1.

FIG. 2 shows an embodiment of a correction network 5 arranged, for changing, in response to the voltage $V_{C3}$ across the capacitor $C_3$, the current produced by the current source circuit 4. This correction network 5 comprises a positive supply voltage conductor 10 and a negative supply voltage conductor 11. In addition this correction network 5 comprises a switch constituted by an npn transistor 12, the emitter of which is connected to conductor 11. The base of this transistor 12 is connected to the output of an inverter 13, the input of which is connected to the output of the clock pulse generator 3 shown in FIG. 1.

Furthermore this correction network 5 comprises a first and a second current-controlled current source circuit, each implemented as a so-called current mirror circuit. In particular, the first current mirror circuit is constituted in a known manner, as shown in FIG. 2, by two npn transistors 14 and 15, the base of transistor 14 being connected to the collector thereof and the transistor 15 being of the type comprising two emitters. The second current mirror circuit is constituted by the mutual coupling, shown in the Figure, of transistor 14 to a npn transistor 16. The emitters of the transistors 14, 15 and 16 are connected to the negative supply voltage conductor 11 and the base of each of the transistors 15 and 16 is connected to the collector of transistor 14.

In addition, the collector of transistor 14 is connected through a resistor 17 to ground potential. The collector of transistor 15 is connected to a differential amplifier constituted by the two npn transistors 18 and 19 whose emitters are interconnected and connected to the collector of transistor 15. The base of transistor 18 is further connected to ground potential and the base of transistor 19 is connected to the common input terminal and output terminal, 7' and 8', of the integrating network 6, so that the voltage $V_{C3}$ is applied to this base.

The collector of transistor 19 is connected to the positive supply voltage conductor 10. The collector circuit of transistor 18 includes a current mirror circuit constituted by a pnp transistor 20, which is connected as a diode, and a pnp transistor 21. The base of transistor 20 is connected on the one hand to the collector thereof and on the other hand to the base of transistor 21. The emitters of these transistors 20 and 21 are, in addition, connected to the positive supply voltage conductor 10. The output of this current mirror circuit is constituted by the collector of the transistor 21 and is connected to both the output of the current source circuit 4 and to the collector of transistor 16. The junction A of the collector of transistor 21 and the output of the current source circuit 4 is, in addition, connected to the input terminal 7 of the integrating network 6.

For a proper understanding of the operation of the correction network shown in FIG. 2, it is assumed that the current source circuit 4 produces, each time a 1-pulse is applied to its input, a current $I_O$ which flows into the integrating network 6. The correction network converts this current into a current $I_s$, which also flows into the integrating network 6. Furthermore, it is assumed that the current source circuit 4 produces each time a 0-pulse occurs at its input, a current $\bar{I}_O$, the magnitude of which is equal to the magnitude of the current $I_O$, but which flows into the current source circuit 4. The correction network 5 converts this current into a current $\bar{I}_s$ which is derived from the integrating network 6.

If now the clock pulse generator 3 produces no clock pulse, transistor 12 is conductive and a current flows through this transistor 12 such that no current flows through the transistor 14. As it is common practice that the current source circuit 4 is arranged so that it does not produce a current when no clock pulse is produced by the clock pulse generator 3, no current is applied to the integrating network 6 in the absence of a clock pulse, and no current is withdrawn from it either.

If, however, clock pulse generator 3 produces a clock pulse, transistor 12 is no longer conducting and a current I will flow through transistor 14 in the direction shown in the drawing. Due to this current, a current 2I flows in the collector circuit of transistor 15 and a current I in the collector circuit of transistor 16. Currents now flow in the collector circuits of the transistors 18 and 19 in the direction shown in the drawing, the magnitudes of these currents being denoted by $I_1$ and $I_2$ respectively. For these currents it holds that $I_1+I_2=2I$. Due to the current $I_1$ in the collector circuit of transistor 18, a current equal to $I_1$ flows in the collector circuit of transistor 21 in the direction shown.

If it is assumed that the voltage $V_{C3}$ across capacitor $C_3$ is equal to zero then $I_1=I_2=I$ so that $I_s=I_O$ and $\bar{I}_s=\bar{I}_O$.

However, if the voltage $V_{C3}$ becomes positive, $I_1$ becomes equal to $I-\Delta I$ and $I_2$ becomes equal to $I+\Delta I$, $\Delta I$ being proportional to $V_{C3}$. As only the constant and unchangeable current I can flow in the collector circuit of transistor 16, and also the current $I_O$ and $\bar{I}_O$ are unchangeable due to the correction network 5, the change in the currents $I_1$ and $I_2$ results in that $I_s$ becomes equal to $I_O-\Delta I$ and that $\bar{I}_s$ becomes equal to $\bar{I}_O+\Delta I$.

If the voltage $V_{C3}$ becomes negative $I_1$ becomes equal to $I+\Delta I$ and $I_2$ becomes equal to $I-\Delta I$. Analogous to the above, this results in that $I_s$ becomes equal to $I_O+\Delta I$ and that $\bar{I}_s$ becomes equal to $\bar{I}_O-\Delta I$.

Non-uniform delta modulation decoder

In the preceding it is tacitly assumed that the positive charging quanta are mutually equal in value and that this is also the case for all negative charging quanta. Such a delta modulation decoder is known as a uniform delta modulation decoder. Although there is a lot of sense in using the correction network in a uniform delta modulation decoder for reducing the signal distortion which would occur if no correction network is used, the use of such a correction network plays a particularly important part in a non-uniform delta modulation decoder. As known, not all the positive charging quanta and also the negative charging quanta are mutually of the same magnitude in a non-uniform delta modulation decoder but the magnitude of these charging quanta are varied in accordance with some method or other. It will be obvious that if, in a non-uniform delta modulation decoder, the ratio $Q_{dec}/\bar{Q}_{dec}$ deviates a given percentage from the ratio $Q_{cod}/\bar{Q}_{cod}$, the absolute deviation can be such that the analog output signal of filter 9 (cf. FIG. 1) is considerably distorted relative to the original analog information signal.

Figure 3:
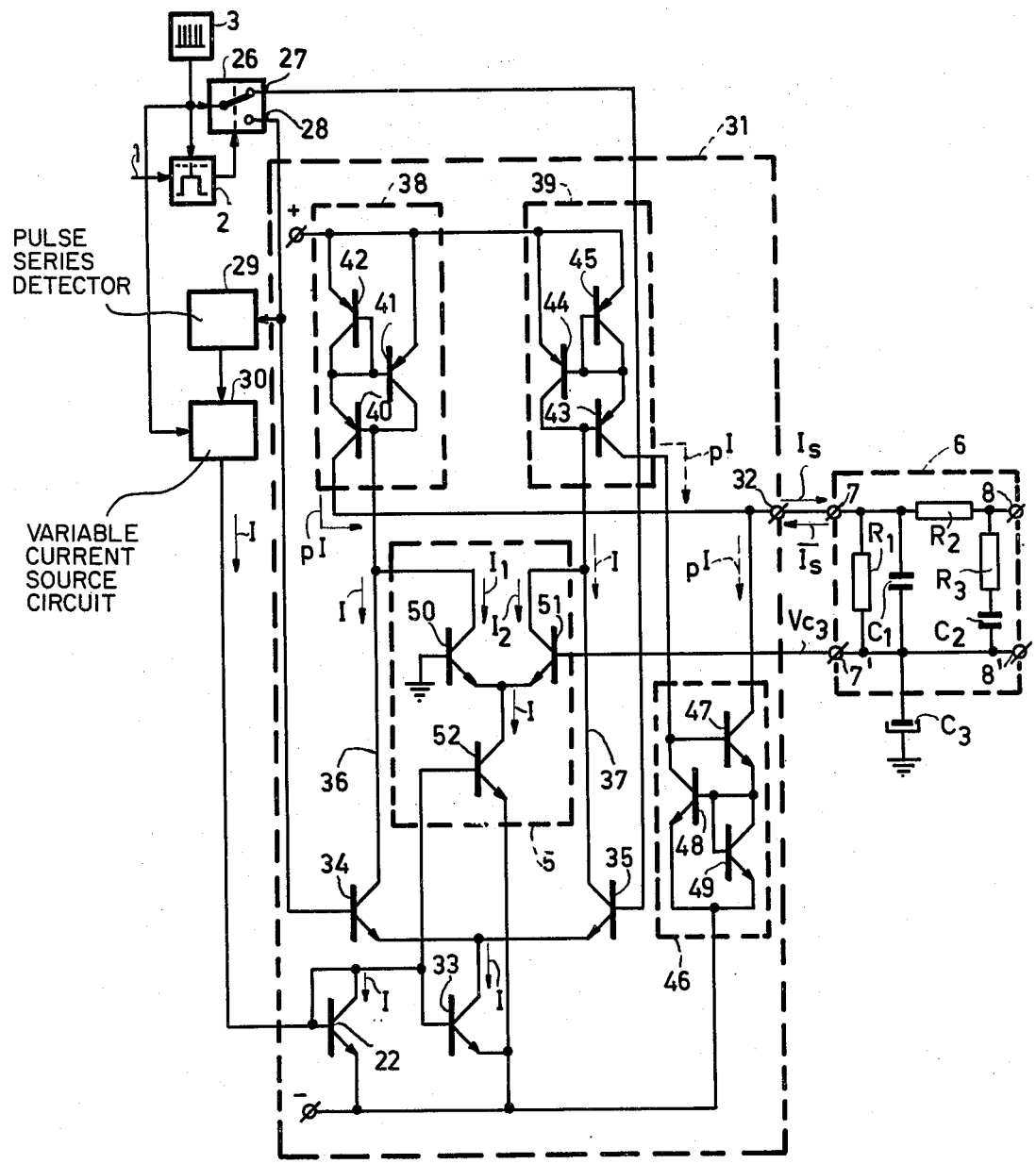
FIG. 3 shows an embodiment of a correction network for use in a non-uniform delta modulation decoder.

FIG. 3 shows a non-uniform delta modulation decoder wherein a methodology is used for changing the magnitude of the charging quanta which is extensively described in references 2, 4, 5 and in many other publications. FIG. 3 shows those elements which are utilized for changing the value of the charging quanta in accordance with the above-mentioned methodology schematically only. In addition, those elements which also occur in the arrangements shown in the FIGS. 1 and 2 have been given the same reference numerals in FIG. 3 as in those FIGS. 1 and 2.

The non-uniform delta modulation decoder of FIG. 3 also comprises the pulse regenerator 2 which is controlled by the clock pulse generator 3 and to which the delta modulation pulses occurring at the transmission line 1 are applied, which signals are generated by a non-uniform delta modulation coder. As customary it is here assumed that the same methodology for changing the magnitude of the charging quanta is used in the coder as in the decoder shown in FIG. 3. The 0-pulses and 1-pulses occurring at the output of the pulse regenerator 2 control a switching device 26, shown symbolically only, to which also the clock pulses of the clock pulse generator 3 are applied and which comprises two outputs 27 and 28. Each time a 0-pulse occurs at the output signal of the pulse regenerator 2, the clock pulse is applied to the output 27 of the switching device 26, while each time a 1-pulse occurs in the output signal of the pulse regenerator the clock pulse is applied to the output 28 of this switching device 26.

Connected to the output 28 of the switching device 26 there is a pulse series detector 29 the output of which is connected to the input of a variable current source circuit 30, which is also controlled by the clock pulse generator 3 and which, at the occurrence of a clock pulse, produces a current I of one polarity only and of a predetermined minimum value $I_O$. This current source circuit may, for example, be implemented in the manner extensively described in reference 1. Each time predetermined first pulse patterns occur in the delta modulation signal the current I which is produced by the circuit 30 is increased by a given amount. If these first pulse patterns do not occur or if certain second pulse patterns occur, this current I is each time reduced by a given amount.

If both positive and negative charging quanta must be applied to the integrating network 6, the unipolar current produced by the current source circuit 30 must be converted into a bipolar current. To this end this current I is applied to a modulation circuit 31 which comprises an output terminal 32 connected to the input terminal 7 of the integrating network 6. This modulation circuit 31 is largely of the same implementation as the modulation circuit in the coder and decoder described in reference 1 and will, for completeness, be described in greater detail below.

The modulation circuit 31 shown comprises a current source in the form of the transistor 33 the base of which is connected to the output of the variable current source circuit 30 and the emitter of which is connected to a negative supply voltage. Together with an npn transistor 22, the emitter of which is connected to the negative supply voltage and the collector of which is connected to its base which in its turn is connected to the base of the transistor 33 and the output of the variable current source circuit 30, this transistor 33 constitutes a current mirror circuit so that, if current source circuit 30 produces a current I, a current I flows in the collector circuit of transistor 22 as well as in the collector circuit of transistor 33 in the direction shown in the Figure. This current I, occurring in the collector circuit of the transistor 33 is used as the supply current for a differential amplifier, which is formed by the two transistors 34 and 35, the emitters of which are interconnected and connected to the collector of the transistor 33. The base of the transistor 34 is connected to the output 28 of the switching device 26 and the base of the transistor 35 is connected to the output 27 of the switching device 26.

The collector circuit of the transistor 34 includes a current-controlled current source circuit 38 and the collector circuit of transistor 35 includes a current-controlled current source circuit 39. These current source circuits 38 and 39 are each also implemented as a current mirror circuit. In particular, the current mirror circuit 38 is constituted in known manner, shown in the Figure, by two pnp transistors 40 and 41 and by a transistor 42 connected as a diode. The collector of the transistor 41 and the base of the transistor 40 are interconnected and connected to the collector of the transistor 34. The emitters of the transistors 41 and 42 are connected to a positive supply voltage. The output of this current mirror circuit 38 is constituted by the collector of the transistor 40. The current mirror circuit 39 is implemented in the same manner as the current mirror circuit 38 and also comprises two pnp transistors 43 and 44 and a pnp transistor 45, connected as a diode. Also in this circuit 39 the base of transistor 43 is connected to the collector of transistor 44 and to the collector of transistor 35. Also here the emitters of the transistors 44 and 45 are connected to the positive supply voltage. The output of the current mirror circuit 39 is constituted by the collector of transistor 43.

In the embodiment shown the output of the current mirror circuit 38 is directly connected to the output terminal 32 of the modulation circuit 31 and the output of the current mirror circuit 39 is connected to this output terminal 32 through a polarity reversing circuit 46. This circuit 46 is likewise implemented as a current mirror circuit but is now, however, build-up with npn transistors. More particularly, this current mirror circuit 46 is constituted in known manner, shown in the Figure, by two transistors 47 and 48 and the transistor 49 which is connected as a diode. The base of the transistor 47 is now connected to the collector of transistor 48 and to the output of the current mirror circuit 39. The emitters of the transistors 48 and 49 are connected to the negative supply voltage. The output of this current mirror circuit 46 is constituted by the collector of transistor 47 and is directly connected to the output terminal 32 of the modulation circuit 31.

The known modulation arrangement 31, described above, operates as follows. If the variable current source circuit 30 produces a current I, a current I will flow, as mentioned above, in the collector circuit of transistor 33 and that in the direction shown in the Figure. When transistor 34 conducts and, consequently, transistor 35 does not conduct, a current pI will flow in the direction shown in the collector circuit of transistor 40; p constitutes the current gain factor of the current mirror circuit 38. A positive charging quantum is now equal to the product of this current pI and the period of time in which transistor 34 is conducting. If transistor 34 is in the non-conducting state and transistor 35 in the conducting state, this current pI will flow in the collector circuit of transistor 43 and that in a direction indicated by means of a dotted line in the Figure. This current is converted by the current mirror circuit 46 into a current the magnitude of which is equal to pI and whose direction is shown in the Figure by means of a dotted line. A negative charging quantum is now equal to the product of said last current pI and the period of time in which transistor 35 is in the conducting state.

In the above it is tacitly understood that the current gain factor of the current mirror circuits 38 and 39 are exactly identical and that the current gain factor of the current mirror 46 is exactly equal to unity. In practice, however, it appeared to be impossible to realize current mirrors which all have the same current gain factors or a current gain factor exactly equal to unity. This is one of the reasons why the ratio $Q_{cod}/\overline{Q}_{cod}$ will never be equal to the ratio $Q_{dec}/\overline{Q}_{dec}$ in delta modulation transmission systems used in practice.

To make the above-defined ratios equal to one another in the decoder shown in FIG. 3, this decoder too comprises a correction network 5. This correction network is now constituted by two transistors 50 and 51 whose emitters are interconnected and which together again constitute a differential amplifier. This correction network 5 also comprises a transistor 52 which functions as a current source and whose base is connected to the output of the variable current source circuit 30, its collector being connected to the emitters of the transistors 50 and 51. Finally, the emitter of this transistor 52 is connected to the negative supply voltage. The collector of transistor 50 is connected to the collector of transistor 34 and its base is connected to ground potential. The collector of transistor 51 is connected to the collector of transistor 35, the voltage $V_{C3}$ across capacitor $C_3$ being applied to its base.

The operation of the differential amplifier constituted by the transistors 50, 51 and 52 is equal to the operation of the differential amplifier constituted by the transistors 34, 35 and 33. If, more particularly, variable current source circuit 30 produces a current of magnitude I, a current, whose magnitude is equal to I and whose direction is shown in FIG. 3, flows in the collector circuit of transistor 33 as well as in the collector circuit of transistor 52. Owing to the current I in the collector circuit of transistor 52 the currents $I_1$ and $I_2$ flow through the collector circuits of the transistors 50 and 51 so that $I_1+I_2=I$. If $V_{C3}$ is equal to zero, than $I_1=I_2=\frac{1}{2}I$.

If transistor 34 now conducts a current $I+I_1$ flows in the collector circuit of transistor 41 and the current mirror circuit 38 produces a current $p(I+I_1)$. A current $I_2$ now flows in the collector circuit of transistor 44 so that the current mirror circuit 39 produces the current $pI_2$. A current $I_s$ which is equal to $p(I+I_1-I_2)$ now appears at the output 32 of the modulation circuit 31.

If transistor 35 is conductive, a current $I_1$ flows in the collector circuit of transistor 41 and the current mirror circuit 38 produces a current $pI_1$. A current $I+I_2$ now flows in the collector circuit of transistor 44, so that the current mirror circuit 39 produces the current $p(I+I_2)$.

The output current $\bar{I}_s$ of the modulation circuit 31 produced in this case is now equal to $p(I-I_1+I_2)$.

In the case $V_{C3}=0$ it holds that $I_1=I_2=\frac{1}{2}I$, so that then: $I_s=pI$ and $\bar{I}_{s=pI}$. If $V_{C3}$ becomes positive it holds that $I_2=\frac{1}{2}I+\Delta I$ and that $I_1=\frac{1}{2}I-\Delta I$, $\Delta I$ being proportional to $V_{C3}$. Consequently $I_s$ becomes equal to $p(I-2\Delta I)$ and $\bar{I}_s$ becomes equal to $p(I+2\Delta I)$. If, however, $V_{C3}$ becomes negative then it holds that $I_1=\frac{1}{2}I+\Delta I$ and that $I_2=\frac{1}{2}I-\Delta I$, so that $I_s=p(I+2\Delta I)$ and $\bar{I}_s=p(I-2\Delta I)$.

What is claimed is:

1. A delta modulation decoder for converting a digital signal into an analog signal, this digital signal being constituted by a sequence of pulses of a first and a second kind, said decoder comprising:

means having applied thereto said digital signal and having a control input and an output, said means producing at its output in response to each of the pulses of the first kind, a positive charge quantum and producing in response to each of the pulses of the second kind, a negative charge quantum;

a decoder integrating network having a first input and a first output terminal, a common second input and second output terminal and including a first integrating capacitor connected between said input terminals;

a second integrating capacitor for connecting said common second input and second output terminals of the integrating network to ground; and means for connecting the common second input and output terminals of said decoder integrating network to the control input of said charge quantum producing means for applying thereto the voltage across the second integrating capacitor to control the magnitude of at least one of the two kinds of charge quanta produced.

* * * * *